United States Patent [19]
Reagan et al.

[11] Patent Number: 5,154,862
[45] Date of Patent: Oct. 13, 1992

[54] METHOD OF FORMING COMPOSITE ARTICLES FROM CVD GAS STREAMS AND SOLID PARTICLES OF FIBERS

[75] Inventors: Peter Reagan, Carlisle; Ann N. Scoville, Winchester; Rebecca Leaf, Cambridge, all of Mass.

[73] Assignee: Thermo Electron Corporation, Waltham, Mass.

[21] Appl. No.: 837,113

[22] Filed: Mar. 7, 1986

[51] Int. Cl.$^5$ .................. C23C 16/00; C04B 35/71
[52] U.S. Cl. ..................... 264/60; 264/121; 427/190; 427/249; 427/255.1
[58] Field of Search .................. 264/60, 121; 427/180, 427/190, 249, 255.1, 255.5

[56] References Cited

U.S. PATENT DOCUMENTS

| | | | |
|---|---|---|---|
| 3,766,000 | 10/1973 | Gibson et al. | 264/60 |
| 4,158,687 | 6/1979 | Yajima et al. | 264/63 |
| 4,315,968 | 1/1982 | Suplinskas | 428/367 |
| 4,373,006 | 2/1983 | Galasso et al. | 427/228 |
| 4,425,407 | 1/1984 | Galasso et al. | 427/249 |
| 4,459,338 | 5/1984 | Angelini et al. | 428/404 |
| 4,460,529 | 7/1984 | Schultze et al. | 264/121 |
| 4,471,017 | 9/1984 | Poeschel et al. | 428/215 |
| 4,472,476 | 9/1984 | Veltri et al. | 427/249 |
| 4,476,178 | 10/1984 | Veltri et al. | 427/249 |
| 4,488,920 | 12/1984 | Danis | 264/59 |
| 4,518,455 | 11/1985 | Muething | 156/613 |
| 4,702,960 | 10/1987 | Ogman | 427/249 |

Primary Examiner—Peter A. Nelson
Attorney, Agent, or Firm—Herbert E. Messenger

[57] ABSTRACT

Disclosed is a method for forming composite articles, particularly ceramic articles, from particles or fibers mixed in a thermally activated reactant gas stream. The particles or fibers are codeposited with material produced by chemical vapor deposition (CVD) onto a heated substrate until the desired thickness of composite is obtained. Removal of the substrate yields a near-net shaped codeposited composite article having a chemical vapor deposition produced matrix with particles or fibers embedded therein a generally uniform distribution. The method provides high deposition rates, and the composite articles produced may have enhanced strength, thermal shock resistance, and corrosion resistance at elevated temperatures.

23 Claims, 4 Drawing Sheets

METHOD OF FORMING COMPOSITE ARTICLES FROM CVD GAS STREAMS AND SOLID PARTICLES OF FIBERS

BACKGROUND OF THE INVENTION

Ceramic materials have been utilized in a variety of high temperature and corrosive environments in recent years. Generally, these heat-resistant articles are produced in brick form for the lining of industrial furnaces in the steel, glass, and smelting industries Although castable refractories have been made, they are generally limited to structural applications requiring common geometric configurations such as rounds, squares, and rectangles, due to the ceramic article's tendency to exhibit brittle fracture upon formation or later machining. Although many mechanisms are known to lead to eventual fracture, including the nature of the material selected, the nature of the applied stress, thermal stresses, strain rates, and environmental factors, no viable solution to reducing brittle fracture susceptibility has yet been isolated. A particularly troublesome factor leading to brittle fracture has been the formation of temperature gradients along different surfaces and areas of the ceramic body which frequently lead to thermal shock during processing. This fracture phenomena has heretofore deterred successful use of heat-resistant ceramic articles in gas turbines, ram-jet engines, missiles, nuclear reactors and various other high temperature processes and operations, especially when complex shapes or large body sizes particularly susceptible to temperature gradients are required.

A number of methods have been attempted to produce heat-resistant ceramics of irregular shape and size. These articles are frequently formed from a slurry consisting of fibers, a refractory compound, and a binder, which is molded into the desired shape and then heat treated to form a composite article as taught in Gibson et al. U.S. Pat. No. 3,766,000, and Kajima et al. U.S. Pat. No. 4,158,687. These heat-resistant articles frequently exhibit weak mechanical shock resistance and relatively weak mechanical strength and corrosion resistance at high temperatures. Moreover, stresses due to temperature gradients along the irregularly shaped portions of the ceramic body generally result in thermal shock, which is not dissipated absent the ability to plastically deform, therefore resulting in failure or thermal fatigue. Finally, the very slow step-up heat treating process required to avoid irregular changes in the thermal expansion or contracting of the structure results in a time consuming and expensive process.

In light of these drawbacks there have been developed cermet composite materials, which improve the ductility of brittle ceramic materials by combining them with ductile metals. Although use of metals with a low coefficient of thermal expansion minimizes the thermal shock problem, these same metals easily oxidize and soften at high temperatures, making instances of actual applications in highly corrosive and elevated temperature environments acutely limited.

Recent technological advances have shown that ceramic articles can be altered to absorb energy and deform plastically before fracture through the introduction of a second phase material into the ceramic matrix. This second phase strengthens the ceramic material and increases the fracture toughness by inhibiting crack propagation through the article. Some development work is believed to be underway on composites utilizing long fibers (length/diameter greater than 100). These composite developments are oriented towards very high performance applications where cost is secondary. However, in applications where cost is a significant factor, as in the automotive industry, particle composites or short fiber composites would be preferred so as to avoid time-consuming and expensive fiber preparation techniques.

Notwithstanding this increased attention directed towards fiber and ceramic composite materials, the prior art still lacks a single step processs for producing near-net shape composite articles consisting of a second phase embedded within the base matrix. As disclosed herein in the instant application, however, a composite article may be formed in a single step process from the coupling of a chemical vapor deposition (CVD) produced matrix with a fine particle second phase embedded within the matrix Such articles are formed at high deposition rates and may obviate the above-described prior art disadvantages.

Although the formation of composite articles by entraining solid particles in a CVD reactant gas stream according to the present invention is believed unknown in the art, the direct application of ceramic materials to various substrates by CVD is well known. In Veltri et al., U.S. Pat. No. 4,476,178 the coating of carbon-carbon materials with an outer layer of CVD silicon carbide is disclosed. Depositing a layer of CVD ceramic material on a fugitive carbon form which is later burned away leaving a CVD composed heat exchanger is described in Danis, U.S. Pat. No. 4,488,920 while Galasso et al U.S. Pat. No. 4,373,006 utilizes CVD silicon carbide to thinly coat carbon fibers for insulation purposes. In such conventional processes, as described above, however, virgin CVD material is applied independent of other materials and solely as a thin coat or outer layer to an already self-sufficient substrate. Additionally, the slow deposition rate encountered in prior art CVD processes, such as about 10 mils/hour for silicon carbide deposited from the decomposition of methyltrichlorosilane and hydrogen, seriously impairs the cost-effectiveness of such an application. Moreover, a thin ceramic coating of CVD material is not seen to significantly enhance either the physical characteristics or corrosion resistance of the final product as is accomplished by the present invention.

SUMMARY OF THE INVENTION

The invention is a method for forming co-deposited composite articles, particularly ceramic composites, for high temperature applications. The invention is premised upon the discovery that composite articles may be formed at high deposition rates from a chemical vapor deposition (CVD) matrix and a second phase of solid particles or fibers dispersed within the matrix. In one important embodiment of the invention the CVD matrix and particle reinforcing second phase are simultaneously built up into the desired shape through entraining of selected particles in a reactant gas stream. Codepositing the CVD matrix and solid particles onto a substrate results in a composite article of a configuration conforming to the shape of the substrate and which is fully densified with a randomly oriented and even particle distribution.

In a preferred embodiment a mixture of silicon carbide particles and a CVD gas are directed onto a substrate of a heated graphite structure such as a tube.

Silicon carbide is produced from the thermally activated chemical reaction occurring in the reactant gas stream and is deposited with the silicon carbide particles on the graphite substrate. The final article produced after removal of the substrate is a codeposited composite tube having silicon carbide particles randomly and uniformly distributed throughout the silicon carbide matrix. Since the deposited material of the codeposited ceramic composite conforms to the substrate finish and to the geometry of the graphite structure, little or no machining is required to produce the final composite product.

Accordingly, it is the primary object of the present invention to provide a new method for producing composite articles from a wide variety of materials, and particularly composite articles for use in high temperature, corrosive environments.

It is another object of this invention to provide a one-step method for producing near-net shaped codeposited articles.

It is another object of the present invention to provide a method for producing irregularly shaped composite articles.

It is another object of this invention to provide a method of producing composite articles at high rates of codeposition of a solid phase and a vapor phase.

BRIEF DESCRIPTION OF THE DRAWING

These and other details and advantages of the invention will be described in connection with the accompanying drawing in which.

DETAILED DESCRIPTION OF PREFERRED EMBODIMENTS

Figure 1:
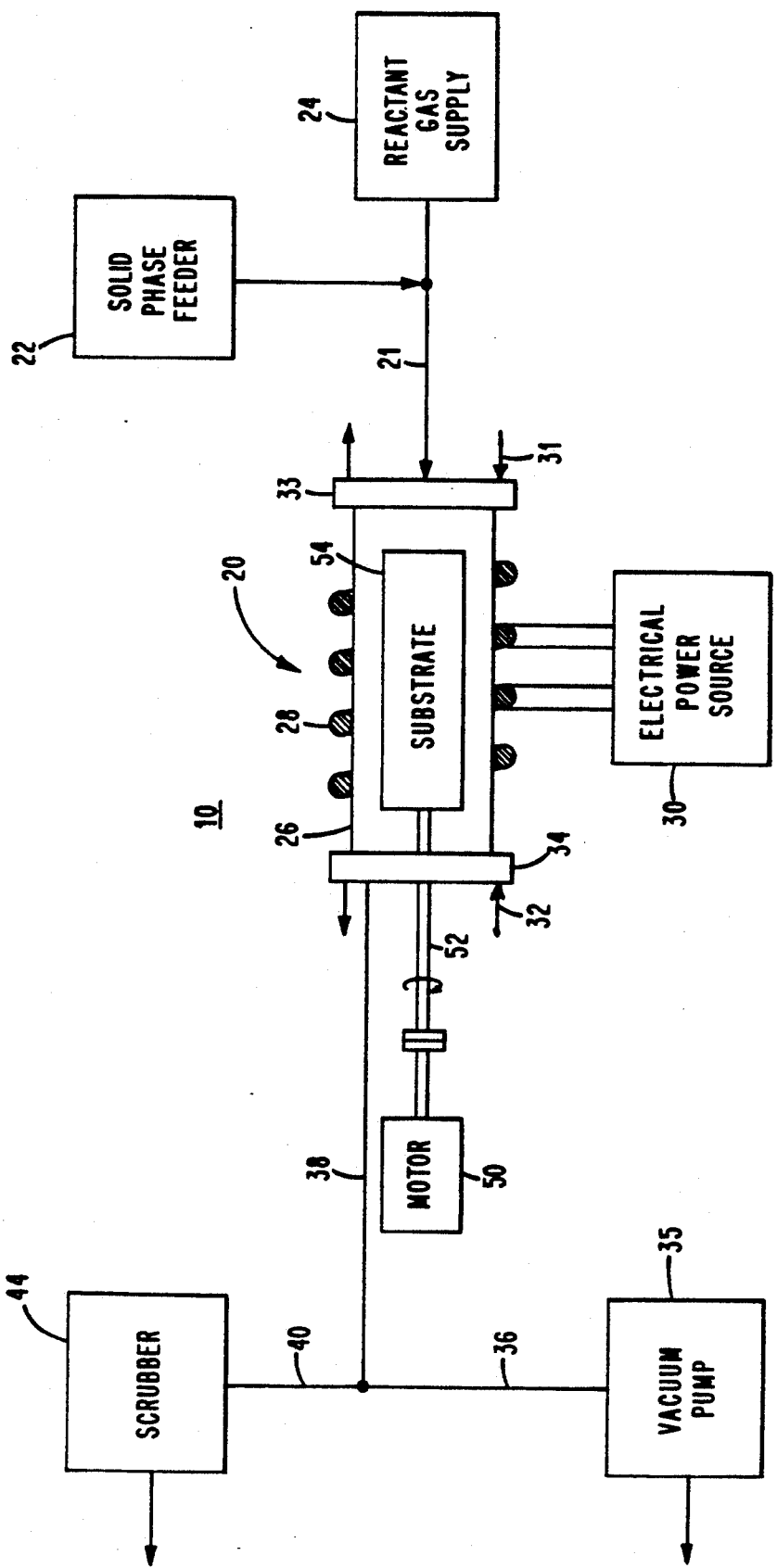
FIG. 1 is a schematic view of a preferred apparatus for practice of the method of the invention.

A preferred method of forming composite articles according to the invention is practiced using a reactor system 10 illustrated in FIG. 1 which includes a reactor 20 to which a mixture of particles or fibers and a reactant gas is supplied along a line 21 from a solid phase feeder 22 and a reactant gas supply 24. The reactor 20 may be a quartz reactor whose outer wall 26 is wrapped with an induction coil 28 connected to an electrical power source 30, and may be cooled by fans (not shown) and by cooling water introduced through appropriate lines 31 and 32 extending into end flanges 33 and 34. A vacuum pump 35 for evacuating the reactor 20 is connected to one branch 36 of an exhaust line 38, and a second branch 40 directs exhaust gases from the reactor 20 to a scrubber 44. Also connected to the reactor 20 are a motor 50 and shaft 52 employed to rotate a substrate 54 within the reactor 20 to insure even codeposition of materials on the substrate according to the method of the invention as set forth in more detail hereinafter.

Figure 2:
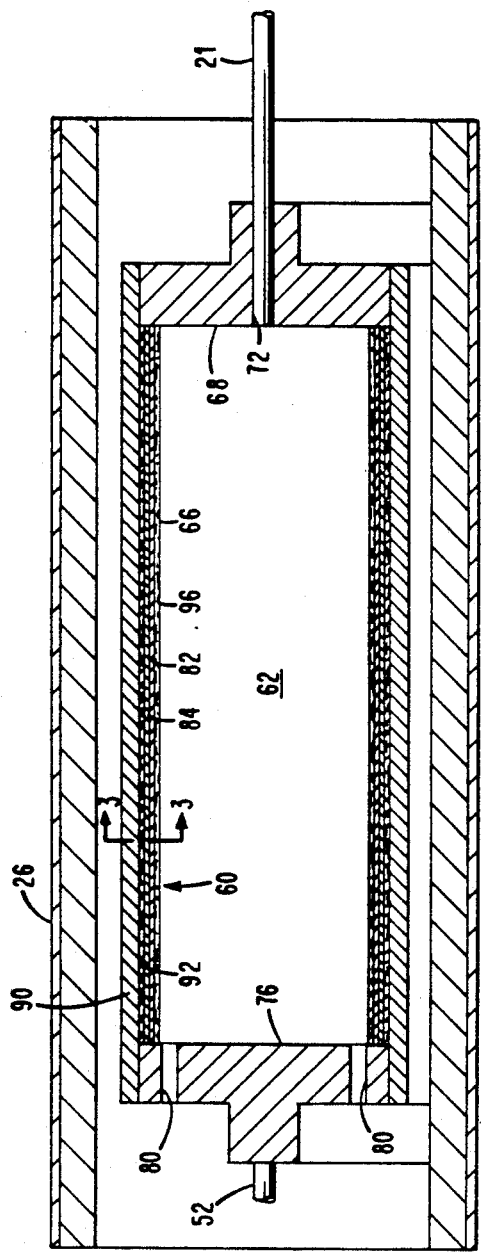
FIG. 2 is a side view in cross-section of the reactor of FIG. 1.
Figure 3:
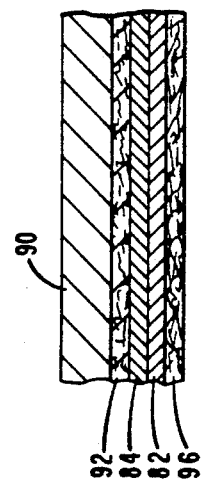
FIG. 3 is a view, enlarged to illustrate details, of a portion of the reactor of FIG. 2 showing a composite article codeposited on a substrate.

FIGS. 2 and 3 illustrate internal details of the reactor 20 and, by way of example, a hollow graphite tube 60 positioned in its reaction chamber 62 and on whose internal surface 66 a composite article may be formed. Adjacent to one end of the tube 60 is an end cap 68 having a passage 72 therein for the introduction into the reaction chamber 62 of a mixture of reactant gas and entrained particles or fibers. The opposite end of the tube is in contact with an end cap 76 having one or more ports 80 for removal of exhaust products from the reactor 20.

The tube 60 or other shaped structure on whose surface a chemical vapor deposition (CVD) matrix and solid particles or fibers are codeposited to form a composite article according to the invention may be of graphite in the form of carbon paper such as Grafoil paper, a product of Union Carbide Corporation. The carbon paper can easily be rolled into a tube and then sealed at various points along its length. If desired, two layers 82, 84 of carbon paper may be used and only the outer layer 84 removed upon completion of the codeposition process leaving the inner layer 82 fused to the composite tube as an additional means of structural support.

If carbon paper is utilized as the substrate for codeposition, a hollow graphite mandrel 90 of shape similar to that of the paper may be provided to support the paper during the process of the invention, with the mandrel ends in turn being supported by the end caps 68 and 76. An annular layer 92 of felt or other flexible material may also be included between the mandrel 90 and the carbon paper tube 60 to help maintain desired dimensional restrictions and to facilitate removal of the composite article from the reactor 20 upon completion of codeposition.

A preferred reactant gas employed in the formation of composite articles according to the invention is a mixture of methyltrichlorosilane (donor gas) and hydrogen (carrier gas), and a preferred second phase material is silicon carbide particles. The mixture of reactant gas and entrained particles is formed by introducing the particles and a carrier gas such as hydrogen from a powder feeder 22 (FIG. 1) into a stream of reactant gas carried by the line 21. The reactant gas and particles typically are supplied to the reactor 20 at or slightly (10° C.-20° C.) above room temperature. A continuous flow of particles from the feeder 22 is typically utilized to ensure a uniform build-up both of the CVD matrix produced from thermal activation of the reactant gas and of the particles which are codeposited with the matrix. The second phase particles may include either long or short particles, or both, with selection dependent on the desired application of the composite article. Silicon carbide particles of 400-600 mesh size have been found to be especially suitable in forming composite tubes.

In the reactor 20 the mandrel 90, heated to a temperature in the range of about 1200° C.-1350° C., in turn heats the carbon tube 60. The heated carbon tube 60 thermally activates the reactant gas, forming CVD vapors which deposit as a matrix along the interior surface of the carbon tube 60. For example, if a mixture of methyltrichlorosilane and hydrogen is employed as the reactant gas, SiC vapors and HCl gas are formed and the SiC is deposited on the inner layer 82 of carbon paper as a solid matrix. The second phase particles (e.g., silicon carbide) codeposit randomly and generally uniformly in the matrix to form the composite deposit 96 (FIG. 3). Exhaust products of the reaction, which include the corrosive gas HCl and may also include $Cl_2$, flow out of the reactor 20 through exhaust ports 80. The reaction associated with a preferred codeposition is summarized as:

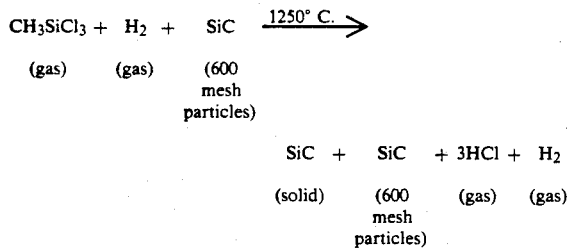

The silicon carbide particles are simultaneously codeposited with the CVD silicon carbide on the surface of the carbon paper tube 60 until the desired thickness of codepositied material is obtained. It is an important advantage of the invention that this codeposition occurs at a high rate—e.g., 50–100 mils/hour as contrasted with about 10 mils/hour in a conventional process depositing silicon carbide by CVD only. During the codeposition the carbon tube 60 and the mandrel 90 or, alternatively, the reactant gas stream, may be rotated to assure uniform deposition of the composite material along the entire circumference of the tube 60.

After codeposition is complete, the tube 60 and composite articles 96 may readily be separated from the mandrel 90 by removing the end cap 76 and sliding the tube along the mandrel. If removal of one or both layers of the carbon tube 60 is also desired, it may then be burned or sand-blasted away from the composite article 96. The resulting article, since it has the dimensions and surface finish of the carbon tube 60 or other shaped structure, should require little or no machining to produce a final product. Moreover, because of the presence of the second phase material (particles or fibers), the composite article may have greater strength and fracture toughness than a comparable CVD-only product.

In alternative embodiments donor gases other than methyltrichlorosilane may be used to produce the composite article of interest, including gaseous mixtures of methylsilane or other chlorosilanes taken from the family of $SiCl_nH_{(4-n)}$, and an inert gas such as argon, helium, nitrogen, or mixtures thereof, at a temperature anywhere between about 800° C.–1350° C., depending upon the various donor gas selected to undergo decomposition. Also, the present invention is not limited to a specific CVD produced material, such as CVD silicon carbide, but could additionally include boron carbide, silicon nitride, boron nitride, oxide ceramics, silicides cermets, or any other material which can be produced by the CVD process. Thus the scope of the matrix material which can be produced by the present invention is limited only by the capability of the chemical vapor deposition process to produce the desired chemical composition.

Figure 4A:
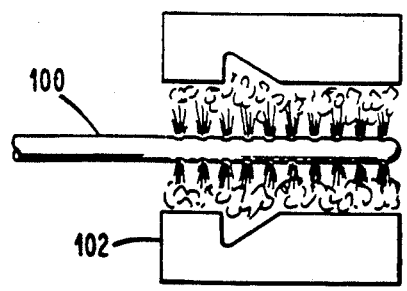
FIGS. 4a-4c are cross-sectional views illustrating steps in a method of producing composite articles by injecting a reactant gas and second phase particles or fibers entrained therein onto the interior surface of an irregularly shaped hollow mandrel.
Figure 4B:
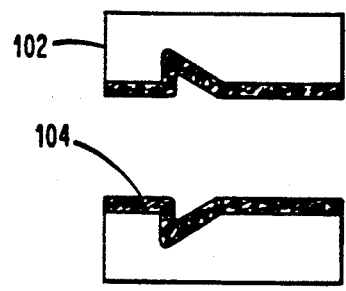
Figure 4C:
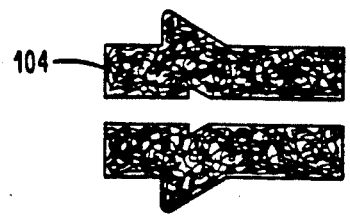

The CVD gas stream and second phase particles or fibers entrained therein may, instead of being deposited on a tube, be directed by an injector 100 onto the interior surface of a selectively shaped hollow mandrel 102 as is illustrated in FIGS. 4a–4c. Thermal decomposition of the reactant gas stream produces a composite 104 of a CVD matrix having a uniform distribution of the second phase material within the matrix, which is deposited along the interior surface of the hollow mandrel. Subsequent removal of the graphite mandrel from the composite results in a near-net shape composite 104 having a surface finish and configuration conforming to the internal surface of the mandrel. Such a process may be suitable for the manufacture of automotive engine components and jet engine components such as jet turbine vanes and other irregularly shaped articles requiring corrosion resistance, high strength, and toughness at elevated temperatures.

The method can also be successfully used to form composite articles on the exterior surface of a mandrel, rather than the interior surface, if such a final surface configuration is desired. All that is required of the surface upon which the CVD material is to be deposited is that it be thermally activated in order to initiate and drive the decomposition process of the donor gas, and that it be compatible with the gases and solid phase material to which it is exposed. Deposition of CVD produced material with solid particles suspended therein has therefore been successfully directed onto flat, square, rectangular, cylindrical, and spherical substrates. Such a composite layer of CVD matrix and second phase particles uniformly and randomly disposed therein may provide a hard, impact and corrosion-resistant covering for otherwise soft materials which are readily susceptible to chemical attack. Hence, inexpensive substrates can be manufactured into a final desired embodiment and then subjected to the disclosed method. The method is particularly suitable for applications where tungsten, molybdenum, or any type of carbon product is so utilized.

In the application of such a process, the underlying material is fabricated into a desired shape, such as a coil, wire or a more complex configuration such as a vane, turbo rotor, rocker arm, or other engine component. The shaped substrate is then maintained at an elevated temperature, thereby providing the thermal activation necessary for the decomposition of the donor gas. The exact temperature range is, of course, dependent upon the ultimate CVD matrix composition selected. A gaseous mixture containing the donor gas, a carrier gas, and particles or fibers of the second phase material is then injected onto and over the heated substrate. For example, a stream of methyltrichlorosilane and hydrogen is injected into the CVD chamber accompanied by a simultaneous flow of silicon carbide particles of 400–600 mesh. The heated methyltrichlorosilane reacts with the hydrogen to produce silicon carbide which is codeposited along with the entrained silicon carbide particles onto the underlying substrate. The coated article thus produced contains a shaped underlying substrate fused to a CVD produced silicon carbide matrix having a uniform and random distribution of silicon carbide particles embedded therein.

Any material may be selected as the underlying substrates so long as it does not decompose at the required CVD temperature nor become subject to corrosive attack by the gases produced upon decomposition of the donor gas. It should be noted in this regard that the decomposition of methyltrichlorosilane occurs at a temperature between about 1200° C.–1350° C., producing highly corrosive hydrochloric acid which can easily eat away a plethora of common substrate materials. However, since the process of the invention is not solely directed at the decomposition of methyltrichlorosilane into silicon carbide, but instead can be used with any matrix which can be produced through chemical vapor deposition, there will be a plurality of embodiments in which less corrosive gases will be produced at less elevated temperatures. In such embodiments, a broad range of materials may be incorporated as the underlying substrate without resulting in decomposition or corrosion during application of the disclosed process.

Although the preferred embodiment utilizes silicon carbide as the CVD material, the codeposited composite article technology could easily be applied to other materials which can be produced through the chemical vapor deposition process. Among the ceramics which can be used are silicon nitride, silicon oxides, boron nitride, boron carbide, cermets, and silicides. The present invention additionally anticipates codeposited composites having a ceramic matrix and second phase of dissimilar material, with the ultimate composition dependent upon the temperature and type of environment for which the ceramic composite is desired Hence, a CVD silicon carbide matrix having boron carbide particles or fibers embedded within the matrix, may be a simple and much less expensive means for producing, for example, nuclear components.

In a preferred embodiment, the composite article is formed from a fine silicon carbide powder, measuring between 400–600 mesh and of the quality usually used in polishing operations which is entrained in a gaseous stream of methyltrichlorosilane and hydrogen as is normally used to produce CVD silicon carbide. In tests of this process, with deposition onto a graphite tube in thermal contact with a mandrel maintained at a temperature of about 1250° C., an unusually high deposition rate of silicon carbide has been achieved, resulting in the codeposition of about 50 mils/hour of CVD silicon carbide and silicon carbide powder as opposed to the usual 10 mils/hour of CVD silicon carbide under a conventional CVD process. Moreover, in purely experimental environments, codeposition rates up to 100 mils/hour of CVD silicon carbide and silicon carbide powder have been achieved. This unexpectedly high deposition rate is a further advantage in the manufacture of composite articles from the disclosed process.

Figure 5:
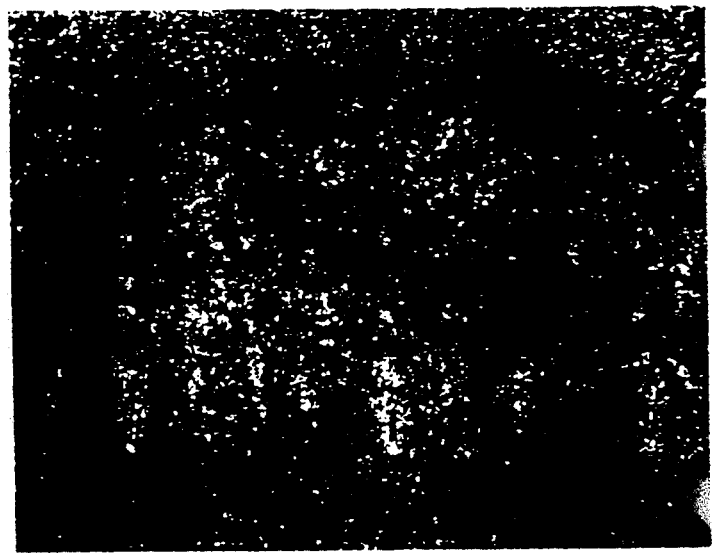
FIG. 5 is a photomicrograph of a transverse cross-sectional view of a codeposited ceramic composite in accordance with the invention.

A typical microstructure of a composite article resulting from the entraining of silicon carbide particles in a methyltrichlorosilane and hydrogen mixture is shown in FIG. 5. The second phase silicon carbide particles which were codeposited along with the CVD produced silicon carbide are clearly visible in the photomicrograph as white dots uniformly dispersed throughout the silicon carbide matrix. No unusual grain growth nor uneven distribution of silicon carbide particles was observed. Moreover, no particular damage was noted (a further advantage of the process since the ceramic matrix forms directly from the gas phase independent of any reaction with the entrained particles).

A test sample of the composite required three times as much voltage and twelve times as much time to etch as compared to a conventional CVD silicon carbide sample, suggesting that the composite had unexpectedly superior resistance to corrosion. Codeposited composite articles produced by the method of this invention may also have enhanced fracture and corrosion resistance without any degradation of strength.

Figure 6:
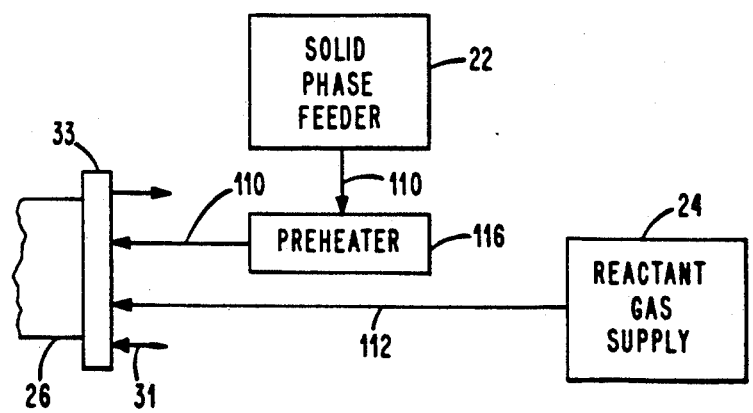
FIG. 6 is a schematic view of a portion of an apparatus similar in many respects to that of FIG. 1 but intended for practice of an alternative embodiment of the invention.

In the preferred embodiment disclosed hereinabove solid particles or fibers are entrained in the reactant gas outside the reactor 20 to form a mixture which is introduced to the reactor 20 as a single stream. FIG. 6 shows an alternative arrangement according to the invention in which the solid phase material and carrier gas are directed to the reactor 20 along a line 110 separate from the line 112 carrying the reactant gas. A preheater 116 is included between the feeder 22 and the reactor 20 to heat the solid phase material to a selected temperature—e.g., to a temperature as high as the deposition temperature of the substrate within the reactor 20. Also a suitable device (not shown) for mixing the solid phase material and reactant gas within the reactor 20 may be provided as part of this alternative arrangement. Such preheating of the particles or fibers prior to their introduction into the reactor 20 enhances the thermal activation of the reactor gas in the reactor 20 and may produce higher codeposition rates, greater uniformity of the composite material, and/or enhanced mechanical properties of the resulting composite article than are achievable by use of a single stream of reactant gas and solid phase material. In this regard it should be noted that preheating of a combined stream of reactant gas and entrained solid phase material would be limited by the need to avoid premature thermal activation of the reactant gas which could lead to deposition in, and clogging of, a supply line or injection nozzle through which the reactants were supplied to the reactor 20.

It is understood that the preceding description is given merely by way of illustration and not in limitation of the invention and that various modifications may be made thereto without departing from the spirit of the invention as claimed. For example, variations in the toughness and structure of composite articles formed by the method may be achieved by varying process parameters such as reactant gas stream flow and temperature, and the size, shape, and materials of the particles or fibers used as a second phase material. The scope of the invention is indicated by the appended claims, and all changes which come within the meaning and range of equivalency of the claims are intended to be embraced therein.

What is claimed is:

1. A method of forming a composite article comprising:
   forming a mixture of a chemical vapor deposition (CVD) reactant gas stream and a solid phase material;
   providing a thermally-activating substrate compatible with said reactant gas stream and reaction products thereof and with said solid phase material;
   heating said substrate;
   directing said mixture onto said heated substrate so that said gas stream reacts to produce a CVD material substantially without reacting with said solid phase material; and,
   codepositing said CVD material and said solid phase material onto said substrate.

2. The method of claim 1 wherein said solid phase material comprises particles.

3. The method of claim 1 wherein said solid phase material comprises fibers.

4. The method of claim 1 wherein said reactant gas stream consists essentially of methyltrichlorosilane and hydrogen and said CVD material is silicon carbide.

5. The method of claim 4 wherein said solid phase material is silicon carbide particles.

6. The method of claim 5 wherein said particles are of 400-600 mesh size.

7. The method of claim 2 wherein said substrate is positioned in a reactor and said mixture-forming step comprises providing a stream of particles and a carrier gas as the output of a powder feeder, and combining said stream of particles and carrier gas with said reactant gas stream outside of said reactor prior to directing said mixture onto said heated substrate.

8. A method as in claim 6 wherein said substrate is formed of carbon paper.

9. A method as in claim 8 wherein said carbon paper is in thermal contact with a mandrel, and said step of heating the substrate comprises heating said mandrel to a temperature in the range of about 1200° C.–1350° C.

10. A method as in claim 5 wherein said codeposition occurs at a rate of at least 50 mils per hour.

11. The method as recited in claim 1, wherein the reactant gas stream includes a mixture of methyltrichlorosilane and hydrogen.

12. The method as recited in claim 1, wherein said reactant gas stream includes a mixture of methylsilane and an inert gas selected from the group consisting of argon, helium, nitrogen, and mixtures thereof.

13. The method as recited in claim 1, wherein said CVD material is selected from the group consisting of nitrides, carbides, ceramic oxides, silicides, and cermets.

14. The method as recited in claim 1, wherein said solid phase material is selected from the group consisting of glass, boron, ceramic, metal, and carbon particles or fibers.

15. The method as recited in claim 1, further including selectively rotating said substrate as said mixture is directed onto the substrate in order to ensure uniform codeposition of said CVD material and said solid phase material.

16. A method as in claim 1 wherein said substrate is positioned in a hollow reactor and said mixture is formed by directing into said reactor, as separate streams, (i) a preheated mixture of said solid phase material and a carrier gas, and (ii) said CVD reactant gas stream.

17. A method of forming a composite article comprising:
   forming a mixture of (i) a reactant gas stream consisting essentially of hydrogen and methyltrichlorosilane and (ii) solid particles of silicon carbide;
   heating a carbon substrate to a temperature sufficient to decompose said methyltrichlorosilane to produce silicon carbide without causing said solid particles of silicon carbide to react; and
   contacting said heated substrate with said mixture, whereby said methyltrichlorosilane decomposes and there is produced on said substrate a deposit of composite material consisting essentially of a matrix of silicon carbide produced by chemical vapor deposition and solid particles of silicon carbide generally uniformly dispersed in said matrix.

18. A method as in claim 17 wherein said deposit of composite material is produced at a rate of at least 50 mils per hour.

19. A method as in claim 17 wherein said substrate is the inner surface of a carbon tube, and further including rotating said tube during deposition of said composite material.

20. A method as claim 17 wherein said substrate is positioned in a hollow reactor and said mixture is formed by directing into said reactor, as separate streams, (i) a preheated mixture of said solid particles and a carrier gas and (ii) said reactant gas stream of hydrogen and methyltrichlorosilane.

21. A method as in claim 1 further including, following said codeposition step, removing said substrate from said codeposited CVD material and solid phase material.

22. A method as in claim 1 wherein said substrate is formed of a material selected from the group consisting of tungsten, molybdenum, and carbon.

23. A method as in claim 1 further including, prior to heating said substrate, forming said substrate into a configuration of a desired shape, and wherein said composite article comprises a coating which is formed and fused to said substrate upon codeposition of said CVD material and said solid phase material.

* * * * *